United States Patent
Lin

(10) Patent No.: US 12,525,920 B2
(45) Date of Patent: Jan. 13, 2026

(54) INPUT MATCHING NETWORK WITH HARMONIC TRAP FOR FREQUENCY MULTIPLIER

(71) Applicant: Analog Devices, Inc., Wilmington, MA (US)

(72) Inventor: Hsin-Chang Lin, Portland, OR (US)

(73) Assignee: Analog Devices, Inc., Wilmington, MA (US)

( * ) Notice: Subject to any disclaimer, the term of this patent is extended or adjusted under 35 U.S.C. 154(b) by 348 days.

(21) Appl. No.: 18/309,533

(22) Filed: Apr. 28, 2023

(65) Prior Publication Data

US 2024/0364264 A1 Oct. 31, 2024

(51) Int. Cl.
*H03B 19/14* (2006.01)
*H03L 7/18* (2006.01)
*H04B 1/18* (2006.01)

(52) U.S. Cl.
CPC .............. *H03B 19/14* (2013.01); *H03L 7/18* (2013.01); *H04B 1/18* (2013.01)

(58) Field of Classification Search
CPC .... H03B 19/14; H03B 5/1228; H03B 5/1847; H03B 5/1212; H03B 5/1215; H03B 5/1243; H03B 5/1231; H03B 5/1852; H03B 1/04; H03B 5/00; H03B 5/08; H03B 5/12; H03B 5/124; H03B 2200/004; H03B 2200/007; H03B 2200/0074
USPC ..................................................... 455/194.2
See application file for complete search history.

(56) References Cited

U.S. PATENT DOCUMENTS

| 2011/0003566 A1* | 1/2011 | Makihara | H01Q 23/00 455/127.1 |
| 2020/0200867 A1* | 6/2020 | Belfiore | G01S 13/931 |
| 2022/0407469 A1* | 12/2022 | Ayranci | H03F 1/0233 |

FOREIGN PATENT DOCUMENTS

EP 0456207 A2 11/1991
JP 2000156612 A 6/2000

OTHER PUBLICATIONS

Cetinoneri et al., "W-Band Amplifiers With 6-dB Noise Figure and Milliwatt-Level 170-GHz Doublers in 45-nm CMOS", IEEE Transactions on Microwave Theory and Techniques, Mar. 2012, 60(3): 692-701.
Hung et al., "High-Power High-Efficiency SiGe Ku-and Ka-Band Balanced Frequency Doublers", IEEE Transactions on Microwave Theory and Techniques, Feb. 2005, 53(2): 754-761.
Wu et al., "A Wideband SiGe BiCMOS Frequency Doubler With 6.5-dBm Peak Output Power for Millimeter-Wave Signal Sources", IEEE Transactions on Microwave Theory and Techniques, Jan. 2018, 66(1): 187-200.

* cited by examiner

*Primary Examiner* — Ajibola A Akinyemi
(74) *Attorney, Agent, or Firm* — Knobbe, Martens, Olson & Bear, LLP

(57) ABSTRACT

Aspects of this disclosure relate to a frequency multiplier with a transmission line in an input matching network. The frequency multiplier can multiply a frequency of a radio frequency input signal. The transmission line can provide a second harmonic trap. The transmission line can be electrically connected between input terminals of a pair of balanced transistors of the frequency multiplier.

20 Claims, 6 Drawing Sheets

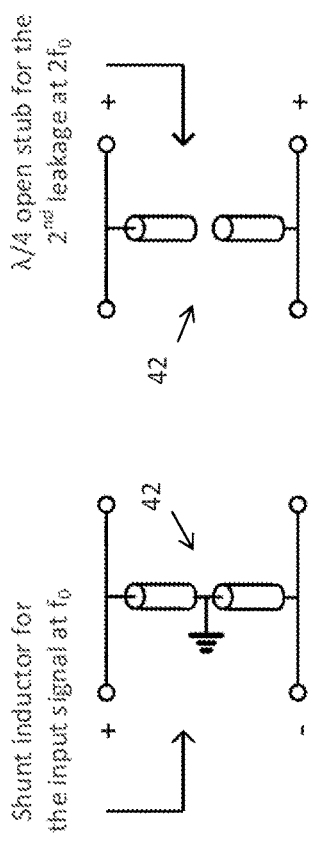
Fig. 5A
Fig. 5B
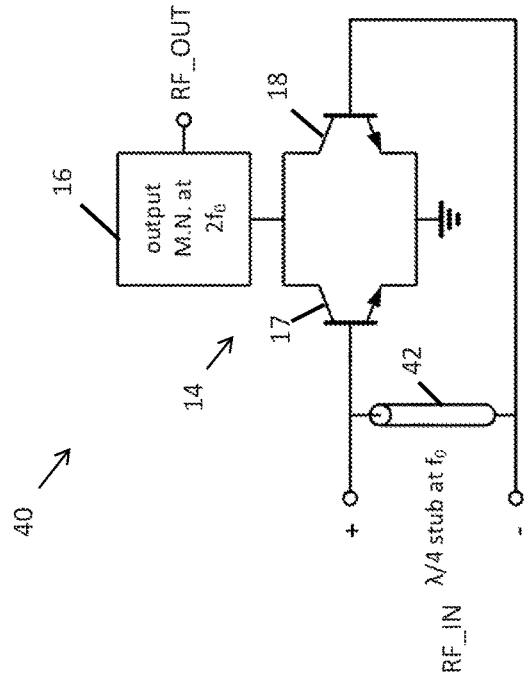
Fig. 4

INPUT MATCHING NETWORK WITH HARMONIC TRAP FOR FREQUENCY MULTIPLIER

BACKGROUND

Technical Field

The disclosed technology relates to frequency multipliers with input matching networks.

Description of Related Technology

Frequency multipliers can be implemented in a variety of applications. For example, a frequency multiplier can be used to multiply a frequency of an output signal from a oscillator to generate a higher frequency signal. Frequency multipliers can multiply the frequency of signals having frequencies on an order of 10 s of gigahertz (GHz). A frequency doubler is an example of a frequency multiplier that generates an output signal having double the frequency of an input signal. There are technical challenges with suppressing leakage current in certain frequency multipliers.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

One aspect of this disclosure is a frequency multiplication circuit that includes a frequency multiplier and an input matching network. The frequency multiplier is configured to multiply a frequency of a radio frequency input signal and to generate a radio frequency output signal. The frequency multiplier includes a pair of balanced transistors. The input matching network includes a transmission line. The transmission line is configured to provide a frequency trap for an even harmonic of the radio frequency input signal. The transmission line is configured to present a short circuit impedance at the even harmonic of the radio frequency input signal.

The even harmonic can be a second harmonic. A frequency of the radio frequency output signal can be two times a frequency of the radio frequency input signal.

The transmission line can be electrically connected between an input terminal of a first transistor of the pair of balanced transistors and an input terminal of a second transistor of the pair of balanced transistors. The transmission line can have a length of $\lambda/4$, where $\lambda$ is a wavelength of the radio frequency input signal. The transmission line can present a shunt inductance to ground at a frequency of the radio frequency input signal.

An output terminal of a first transistor of the pair of balanced transistors can be electrically connected to an output terminal of a second transistor of the pair of balanced transistors. The radio frequency input signal can be a differential signal, and the radio frequency output signal can be a single ended signal. The input matching network can include a pair of series capacitors, and the pair of balanced transistors can receive the radio frequency input signal by way of the pair of series capacitors.

The frequency of the input radio frequency signal can be in a range from 30 gigahertz to 100 gigahertz.

Another aspect of this disclosure is a frequency multiplication circuit for multiplying frequency of a radio frequency signal. The frequency multiplication circuit includes a frequency multiplier and an input matching network. The frequency multiplier includes a pair of balanced transistors. The frequency multiplier is configured to receive a radio frequency input signal and generate a radio frequency output signal having a frequency that is two times a frequency of the radio frequency output signal. The input matching network includes a transmission line electrically connected between an input terminal of a first transistor of the pair of balanced transistors and an input terminal of a second transistor of the pair of balanced transistors. The transmission line has a length of $\lambda/4$ where $\lambda$ is a wavelength of the radio frequency input signal. The transmission line is configured to present a shunt inductor to ground at the frequency of the radio frequency input signal and to present a short circuit impedance at the frequency of the radio frequency output signal. The frequency of the radio frequency output signal is an even harmonic of the radio frequency input signal.

The radio frequency input signal can be a differential signal, and the radio frequency output signal can be a single ended signal. The input matching network can include a first series capacitor and a second series capacitor, and the frequency multiplier can be configured to receive the radio frequency input signal by way of the first series capacitor and the second series capacitor. The frequency multiplication circuit can include a balun having balanced terminals including a first terminal electrically connected to the first series capacitor and a second terminal electrically connected to the second series capacitor. The frequency multiplication circuit can include a third capacitor electrically connected between the first terminal of the balun and the second terminal of the balun.

The pair of balanced transistors can be bipolar transistors, and the input terminal of the first transistor of the pair of balanced transistors can be a base of the first transistor. A biasing element can be configured to provide a bias voltage to the input terminal of the first transistor of the pair of balanced transistors.

The frequency multiplier can include a cascode transistor arranged in cascode with the pair of balanced transistors.

The frequency of the radio frequency input signal can be in a range from 30 gigahertz to 100 gigahertz. The frequency of the radio frequency output signal can be in a range from 100 gigahertz to 200 gigahertz.

Another aspect of this disclosure is an antenna on a chip that includes an oscillator, a frequency multiplier coupled to an output of the oscillator, an input matching network, an antenna embodied on a single chip. The frequency multiplier includes a pair of balanced transistors. The frequency multiplier is configured to receive a radio frequency input signal and generate a radio frequency output signal having a frequency that is two times a frequency of the radio frequency input signal. The input matching network includes a transmission line configured to provide a frequency trap for a second harmonic of the radio frequency input signal. The transmission line is electrically connected between an input terminal of a first transistor of the pair of balanced transistors and an input terminal of a second transistor of the pair of balanced transistors. The antenna is coupled to the frequency multiplier.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

BRIEF DESCRIPTION OF THE DRAWINGS

Embodiments of this disclosure will be described, by way of non-limiting example, with reference to the accompanying drawings.

FIG. 4 is a schematic diagram of frequency multiplication circuit with a shunt transmission line at an input of a pair of balanced transistors according to an embodiment.

FIGS. 5A and 5B are schematic diagrams illustrating functionality of the transmission line of FIG. 4 at two different frequencies.

DETAILED DESCRIPTION OF CERTAIN EMBODIMENTS

Figure 2:
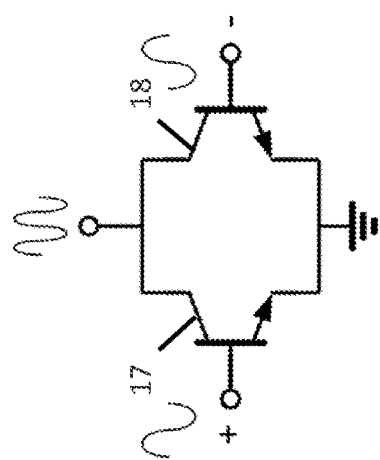
FIG. 2 is a schematic diagram of a pair of balanced transistors of a frequency multiplier.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the illustrated elements. Further, some embodiments can incorporate any suitable combination of features from two or more drawings.

Frequency multipliers can generate an output signal having a frequency that is a positive integer multiple of a frequency of an input signal, where the positive integer is greater than one. For example, a frequency doubler is a frequency multiplier that generates an output signal having a frequency that is two times a frequency of an input signal. In certain applications, a frequency multiplier can multiply a frequency of a local oscillator signal. This can enable a lower frequency local oscillator with lower phase-noise and higher spectral purity to be implemented.

Impedance matching in a frequency multiplication circuit can be significant for achieving efficient power transfer. Impedance matching can be performed at an input of a frequency multiplier to match a nominal input impedance, such as a 100 Ohm differential input impedance. Impedance matching can also be performed at an output of a frequency multiplier match a nominal output impedance, such as a 50 Ohm output impedance. In this disclosure, technical solutions to provide a trap circuit for even harmonic leakage in input matching networks are provided. A trap circuit can be referred to as a frequency trap.

Aspects of this disclosure relate to frequency multiplication circuits that include a frequency multiplier and an input matching network. The input matching network can include a transmission line that functions as a second harmonic trap and provides input matching for the frequency multiplier. The transmission line can present shunt inductors to ground at the frequency of a radio frequency input signal provided to the frequency multiplier and to present a short circuit impedance at an even harmonic of the radio frequency input signal, such as at two times the frequency of the radio frequency input signal. A radio frequency output signal generated by the frequency multiplier can have a frequency that is two times the frequency of the radio frequency input signal. The transmission line can have a length of $\lambda/4$ where $\lambda$ is a wavelength of the radio frequency input signal. The transmission line can be electrically connected between input terminals of a pair of balanced transistors of the frequency multiplier.

Figure 1:
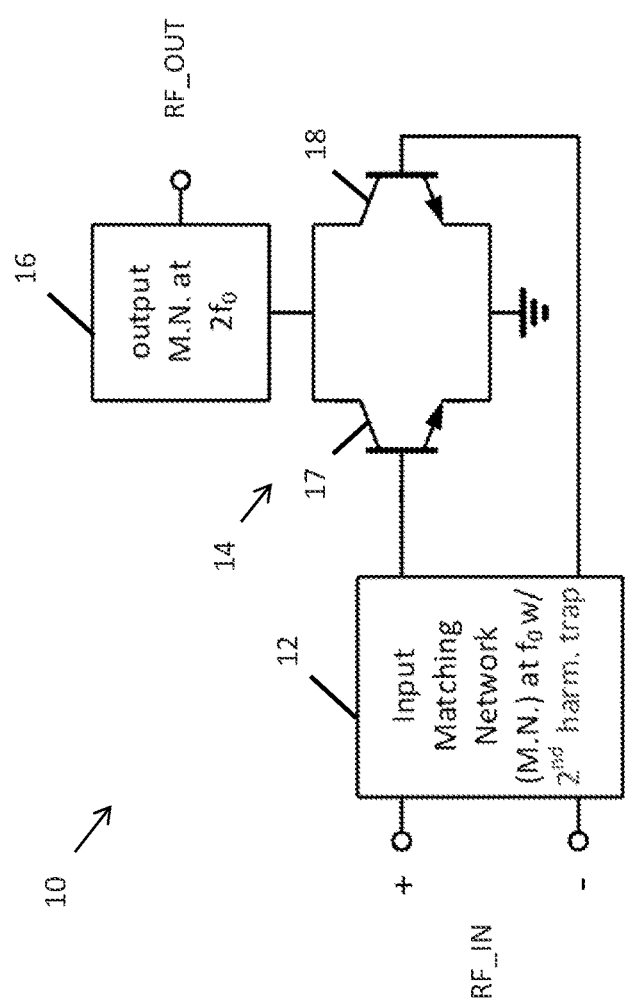
FIG. 1 is a schematic diagram of a frequency multiplication circuit according to an embodiment.

FIG. 1 is a schematic diagram of a frequency multiplication circuit 10 according to an embodiment. The frequency multiplication circuit 10 includes an input matching network 12, a frequency multiplier 14, and an output matching network 16. The frequency multiplier 14 includes a pair of balanced transistors 17 and 18. The frequency multiplication circuit 10 can receive a differential radio frequency input signal RF_IN having a frequency $f_0$. The input matching network 12 can provide impedance matching at the frequency $f_0$. The input matching network 12 can provide a second harmonic trap. The frequency multiplier 14 can receive the differential radio frequency input signal RF_IN by way of the input matching network 12. The frequency multiplier 14 can generate a single-ended radio frequency output signal RF_OUT having a frequency $2f_0$ that is two times the frequency $f_0$ of the differential radio frequency input signal RF_IN. The output matching network 16 can provide impedance matching at the frequency $2f_0$.

The input matching network 12 including a second harmonic trap can improve efficiency of the frequency multiplication circuit 10. For example, such an input matching network 12 can increase output power and conversion gain. Including the second harmonic trap in the input matching network 12 can reduce circuit area compared to other second harmonic traps that are not included in an input matching network.

FIG. 2 is a schematic diagram of a pair of balanced transistors 17 and 18 of a frequency multiplier. The pair of balanced transistors 17 and 18 are configured to receive a differential radio frequency input signal across their input terminals and to generate a radio frequency output signal at output terminals that are connected with each other. This circuit topology can combine even order harmonics and cancel odd order harmonics. The pair of balanced transistors 17 and 18 can be referred to as a differential pair of transistors.

As illustrated in FIG. 2, the pair of balanced transistors 17 and 18 can include a pair of bipolar transistors with the collectors electrically connected with each other. A differential radio frequency input signal is received at the bases of the pair of balanced transistors 17 and 18 in FIG. 2. In FIG. 2, the transistors 17 and 18 are common emitter amplifiers.

Alternatively, a pair of balanced transistors can include a pair of field effect transistors with drains electrically connected with each other. In such a pair of balanced transistors, a differential radio frequency input signal can be received at gates of the pair of field effect transistors. Such transistors can be common source amplifiers.

While the pair of balanced transistors 17 and 18 are illustrated as bipolar transistors, frequency multipliers disclosed herein can include any suitable transistors. For example, frequency multipliers can include a pair of balanced transistors that include, but are not limited to, bipolar transistors, NPN bipolar transistors, heterojunction bipolar transistors, field effect transistors, semiconductor-on-insulator or silicon-on-insulator field effect transistors, complementary metal oxide semiconductor (CMOS) transistors, silicon germanium transistors such as silicon germanium bipolar CMOS (BiCMOS) transistors, InGaP bipolar transistors, gallium arsenide transistors such as gallium arsenide high electron-mobility transistors (HEMTs), pseudomorphic high electron-mobility transistors (pHEMTs), InP HEMTs, or the like.

Figure 3:
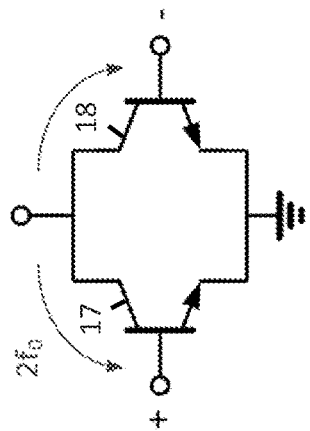
FIG. 3 is a schematic diagram of the pair of balanced transistors of FIG. 2 where second harmonic leakage illustrated.

FIG. 3 is a schematic diagram of the pair of balanced transistors 17 and 18 of FIG. 2 where second harmonic leakage illustrated. The circuit topology illustrated in FIGS. 2 and 3 can experience second harmonic leakage. The second order harmonics at the output of a frequency multiplier can feedback to the pair of balanced transistors 17 and 18 and then cancel the second order harmonics at the output. This can result in relatively low conversion gain and relatively low output power.

A second harmonic trap at the input side of a frequency multiplier can filter the second harmonic leakage. The second harmonic trap can be implemented using $\lambda/4$ short stubs at a fundamental frequency where $\lambda$ is a wavelength of a radio frequency input signal, $\lambda/4$ open stubs at second harmonic frequency where $\lambda$ is a wavelength of a radio frequency output signal, or LC notch filters at $2f_0$.

However, certain second harmonic traps consume a relatively large area for implementation. This can be problematic for systems that desire small area for each circuit block. For example, a phased array system involving antennas with $\lambda/4$ spacing to reduce and/or avoid grating lobes. Accordingly, there can be limited physical area for circuit blocks. Thus, using a second harmonic trap that is relatively large would be difficult in this case. At the same time, without a second harmonic trap, a frequency multiplier can suffer from low output power and low conversion gain.

Moreover, certain second harmonic traps can undesirably impact an input matching network. For example, an extra input matching network, extra loss, narrow bandwidth, or any combination thereof can be experienced with certain second harmonic traps.

FIG. 4 is a schematic diagram of frequency multiplication circuit 40 with a shunt transmission line 42 at an input of a pair of balanced transistors 17 and 18 according to an embodiment. The transmission line 42 is a shunt $\lambda/4$ transmission line at f0 at the input of the pair of balanced transistors 17 and 18. The transmission line 42 can be referred to a stub.

FIGS. 5A and 5B are schematic diagrams illustrating functionality of the transmission line 42 of FIG. 4 at two different frequencies. The shunt $\lambda/4$ transmission line 42 can present as shunt inductance for the differential radio frequency input signal RF_IN at frequency $f_0$ as illustrated in FIG. 5A. The shunt $\lambda/4$ transmission line 42 can also present as a $\lambda/4$ open stub for the second harmonic leakage from output at frequency $2f_0$ as illustrated in FIG. 5B.

Using one $\lambda/4$ transmission line at $f_0$ for both second harmonic leakage cancellation and the as a shunt inductor as part of the input matching network can significantly reduce chip area relative to other designs. The transmission line 42 of the frequency multiplication circuit 40 can also improve the frequency multiplier efficiency since fewer elements are used for input impedance matching and second harmonic leakage cancellation.

Figures 6A, 6B, 6C:
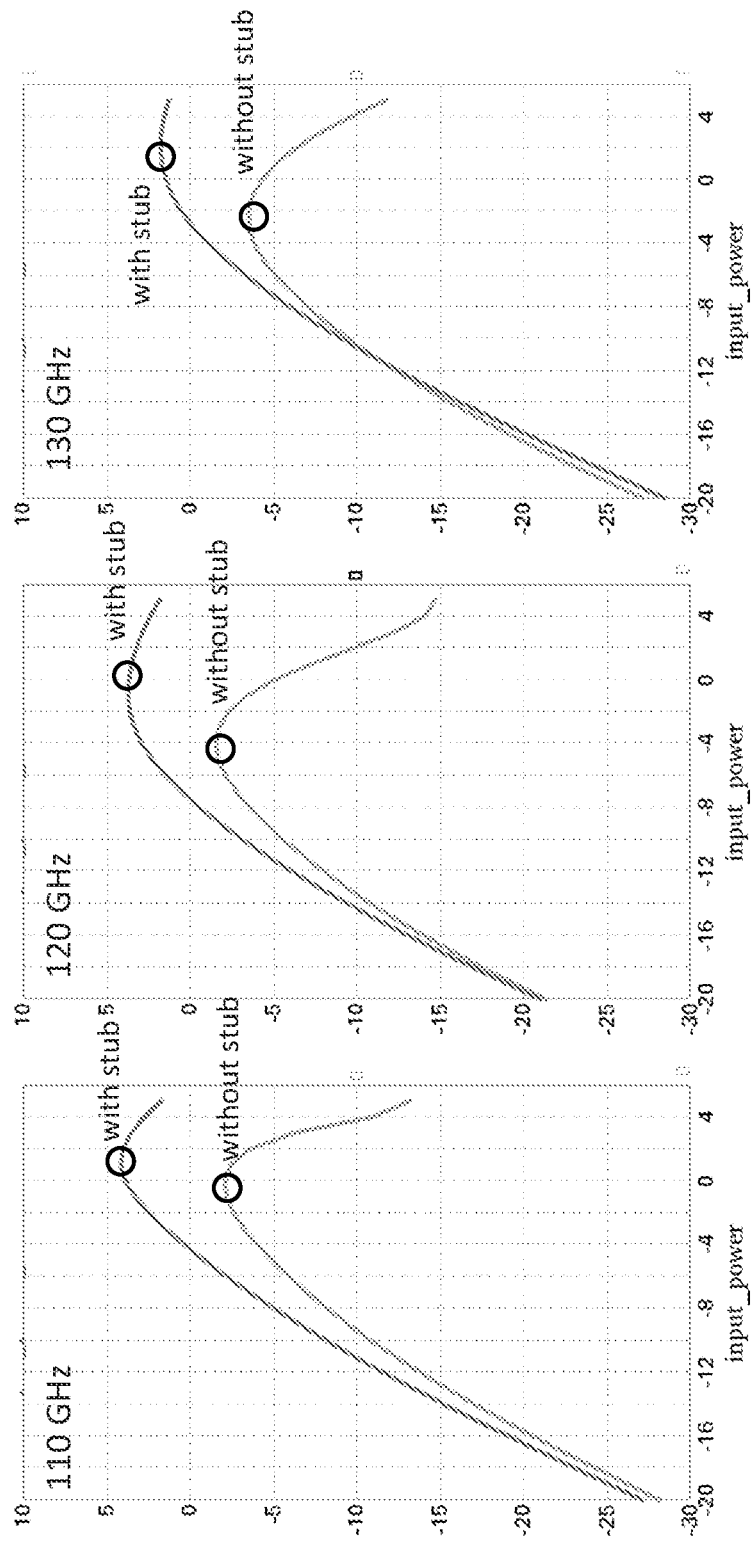
FIGS. 6A, 6B, and 6C are graphs what show improvement in output power for a frequency multiplier with a transmission line functioning as a second order harmonic trap in an input matching network according to an embodiment at different frequencies.

FIGS. 6A, 6B, and 6C are graphs what show improvement in output power for a frequency multiplier with a transmission line functioning as a second harmonic trap in an input matching network according to an embodiment at different frequencies. These graphs illustrate output power versus input power with and without a short stub at three different radio frequency output frequencies. With a shunt transmission line like the transmission line 42 of FIG. 4, a frequency multiplication circuit can achieve around a 6 decibel (dB) improvement in output power relative to not including the transmission line. This improvement in output power is indicated for an output frequency of 110 gigahertz (GHz) in FIG. 6A, an output frequency of 120 GHz in FIG. 6B, and an output frequency of 130 GHz in FIG. 6C. The transmission line can be referred to as a stub or short stub.

Figure 7:
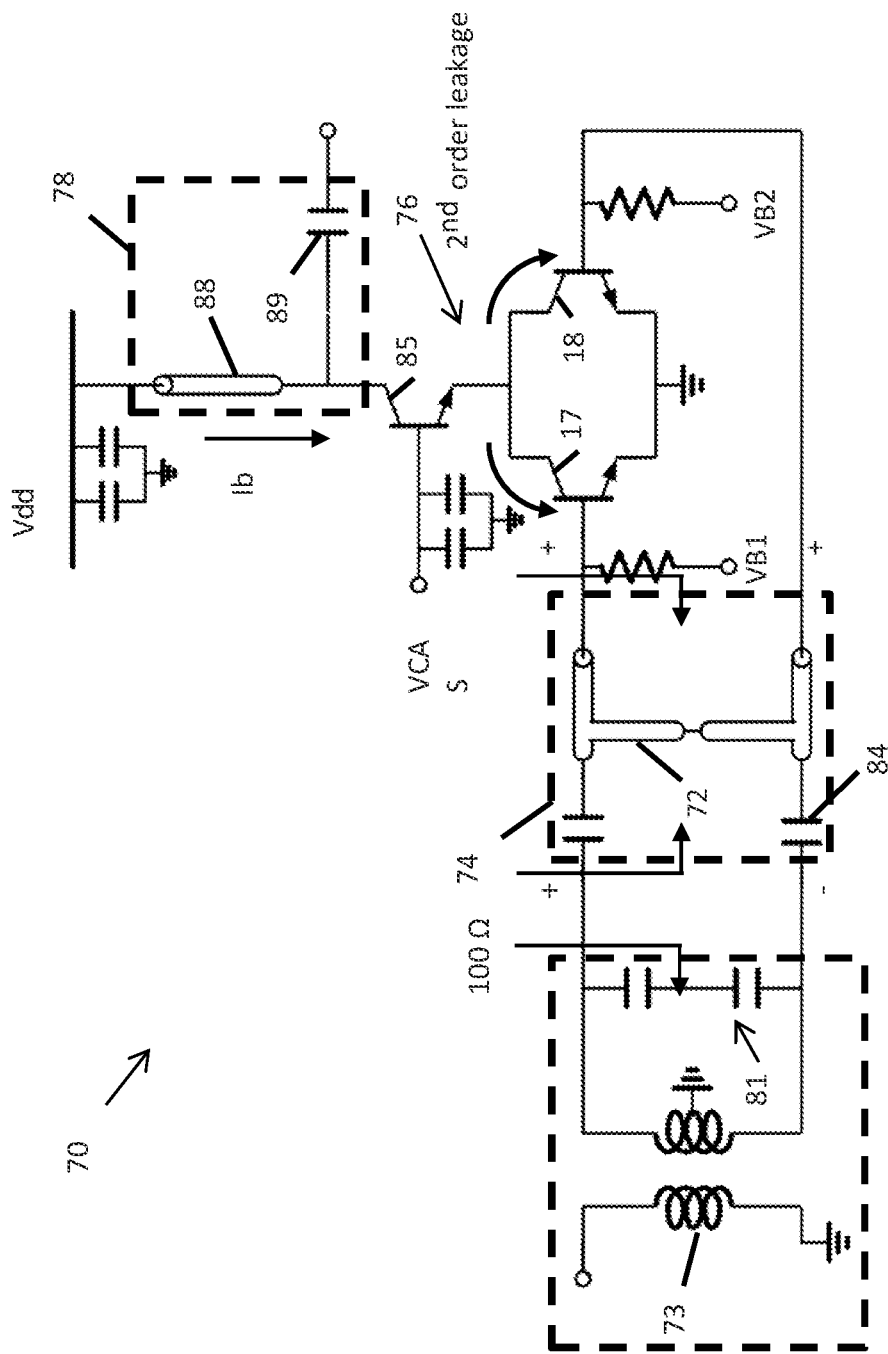
FIG. 7 is a schematic diagram of a frequency multiplication circuit according to an embodiment.

FIG. 7 is a schematic diagram of a frequency multiplication circuit 70 according to an embodiment. The frequency multiplication circuit 70 includes a transmission line 72. The transmission line 72 is a $\lambda/4$ stub at a fundamental frequency $f_0$. The transmission line 72 also functions as a second harmonic trap to suppress $2f_0$ leakage. Accordingly, the transmission line 72 can provide shunt inductors for a fundamental frequency signal and a short circuit impedance at a second harmonic frequency. The transmission line 72 can be implemented in less area that including one shunt transmission line for second harmonic trap connected to an input terminal of each transistor of a balanced pair). In certain applications, the transmission line 72 can reduce area of the frequency multiplier 70 about 35% relative to using two 24 short stubs as second harmonic traps.

As illustrated, the frequency multiplication circuit 70 includes a balun 73, an input matching network 74, a frequency multiplier 76, and an output matching network 78.

The balun 73 can generate a differential radio frequency input signal from a single-ended radio frequency input signal. The single-ended radio frequency input signal can be at 60 GHz. There can be a nominal impedance of 50 Ohm at an input of the balun, for example. At an output of the balun 73 that provides a differential radio frequency input signal, there can be a nominal impedance of twice the impedance at the input or 100 Ohms, for example. One or more capacitors 81 can be coupled across the differential output terminals of the balun 73. The one or more capacitors 81 are part of the balun design to make the balun 73 have a 100 Ohm differential output impedance. The differential output terminals of the balun 73 are balanced terminals. The differential output terminals of the balun 73 include a first terminal electrically connected a first series capacitor 83 and a second terminal electrically connected to a second series capacitor 84.

The input matching network 74 can provide input matching at the fundamental frequency $f_0$. The input matching network includes series capacitors 83 and 84 and the transmission line 72. The frequency multiplier 76 is configured to receive the differential radio frequency input signal by way of the series capacitors 83 and 84. In certain applications, the series capacitors 83 and 84 can have roughly half of the capacitance compared to similar series capacitors in an input matching network that includes two shunt inductors connected between respective series capacitors and ground. The transmission line 72 is coupled between input terminals (e.g., bases) of the pair of balanced transistors 17 and 18 of the frequency multiplier 76. The transmission line 72 provides shunt inductance for input matching and a second harmonic trap. Functionality of the transmission line 72 at the fundamental frequency and the second harmonic will be discussed with reference to FIGS. 8A and 8B. In the illustrated input matching network 74, there are no series capacitors coupled between the transmission line 72 and input terminals of transistors 17 and 18 of the frequency 76.

The frequency multiplier 76 includes a pair of balanced transistors 17 and 18 and a cascode transistor 85. The differential radio frequency input signal can be provided across input terminals of the transistors 17 and 18. The differential radio frequency input signal generated by the balun 73 can be received by the input terminals of the transistors 17 and 18 by way of the series capacitors 83 and 84 of the input matching network 74. A bias voltage $V_{B1}$ can be applied to the input terminal of the transistor 17 by a first biasing circuit element 86. This bias voltage can be a direct current (DC) voltage. Similarly, a bias voltage $V_{B2}$ can be applied to the input terminal of the transistor 18 by a second biasing circuit element 87. This bias voltage can be a DC voltage. The first biasing circuit element 86 can be a resistor. The second biasing circuit element 87 can be resistor.

The pair of balanced transistors 17 and 18 have respective output terminals electrically connected with each other. The pair of balanced transistors 17 and 18 are arranged to generate a single-ended radio frequency output signal where a fundamental frequency and odd harmonics of the differential radio frequency input signal are cancelled and even harmonics of the radio frequency input signal are added. The single-ended radio frequency output signal can have twice the frequency of the differential radio frequency input signal. In the frequency multiplier 74, the cascode transistor 85 is arranged in cascode with the pair of balanced transistors 17, 18. The cascode transistor 85 is arranged to receive a cascode bias voltage $V_{CA}$. The cascode transistor 85 can amplify the signal from the pair of balanced transistors 17 and 18. The cascode transistor 85 can also reduce the Miller effect of the transistors 17 and 18.

The output matching network 78 provides output matching at a frequency of the radio frequency output signal, which is two times a frequency of the radio frequency input signal. The output matching network 78 includes an inductor 88 and a capacitor 89. The inductance of the inductor 88 and the capacitance of the capacitor 89 can together provide output matching at the frequency of the radio frequency output signal for a nominal output impedance, such as 50 Ohms.

Figures 8A, 8B:
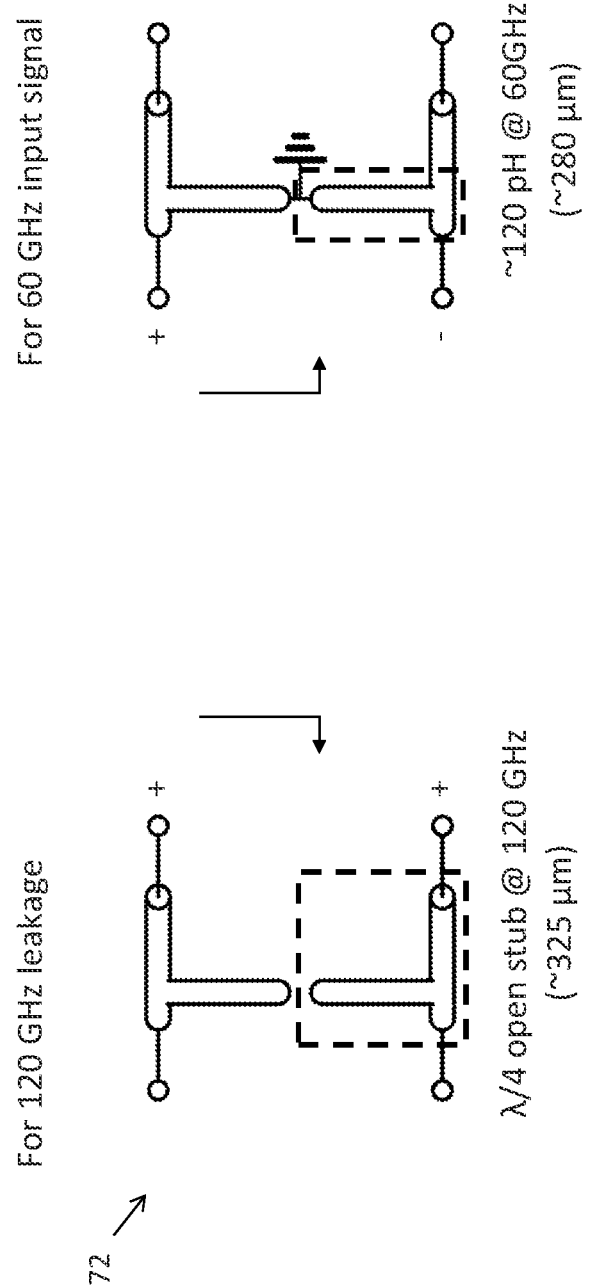
FIGS. 8A and 8B are schematic diagrams illustrating functionality of the transmission line of FIG. 7 at two different frequencies.

In an example application, the frequency multiplier 76 can receive a 60 GHz differential input signal and generate a 120 GHz single-ended output signal. FIGS. 8A and 8B are schematic diagrams illustrating functionality of the transmission line 72 of FIG. 7 for this example application.

FIG. 8A illustrates the functionality of the transmission line 72 for 120 GHz leakage. The transmission line 72 can provide a shunt $\lambda/4$ open stub at 120 GHz, which is a short circuit at 120 GHz. This can have a length of about 325 micrometers in certain applications.

FIG. 8B illustrates the functionality of the transmission line 72 for a 60 GHz input signal. The transmission line 72 can provide a shunt inductance of around 120 picohenries (pH) at 60 GHz. This can have a length of about 280 micrometers in certain applications. The transmission line 72 can present the shunt inductance at 60 GHz coupled to an input terminal of each of the balanced transistors 17 and 18 of FIG. 7.

Frequency multiplication circuits disclosed herein can be used to multiply a signal having any suitable frequency. Advantages of reducing even harmonic leakage can be particularly advantageous at higher frequencies. Input signals can be radio frequency signals having frequencies having at least a 1 GHz frequency or millimeter wave frequencies. In certain applications, an input signal to a multiplication circuit can be on the order of 10 s of gigahertz. In some instances, an input signal to a multiplication circuit can have a frequency in a range from 100 GHz to 150 GHz. Output signals can be radio frequency signals having a frequency of at least 2 GHz or millimeter wave frequencies and/or microwave frequency signals having frequencies in a range from 1 GHz to 1000 GHz. In certain applications, frequency multiplication circuits disclosed herein can have input signals having frequencies in a range from 10 GHz to 150 GHz, such as frequencies in a range from 30 GHz to 100 GHz. In certain applications, frequency multiplication circuits disclosed herein can have output signals having frequencies in a range from 20 GHz to 300 GHz, such as frequencies in a range from 100 GHz to 300 GHz, in a range from 100 GHz to 150 GHz, or in a range from 100 GHz to 200 GHz.

Although embodiments disclosed herein may relate to second harmonic traps and frequency doublers, any suitable principles and advantages disclosed herein can be implemented in frequency multipliers that multiply an input frequency by a positive even integer and have a trap circuit for the positive even integer harmonic in an input matching network. For instance, a transmission line implementing a fourth harmonic trap circuit in an input matching network for a frequency multiplier that multiplies an input frequency by four.

Shunt $\lambda/4$ transmission lines at a fundamental frequency $f_0$ that also function as a second harmonic trap are disclosed. The shunt $\lambda/4$ transmission line at the fundamental frequency $f_0$ can be part of an input matching network. This can replace a shunt inductance of certain other input matching networks and improve efficiency by using fewer matching components that have lower overall loss. Shunt $\lambda/4$ transmission disclosed herein can be included in input matching networks for frequency multipliers. A shunt $\lambda/4$ transmission line can be coupled between input terminals of a balanced pair of transistors in any other suitable circuit in accordance with any suitable principles and advantages disclosed herein.

Frequency multiplication circuits disclosed herein can be implemented in any suitable application that can benefit from frequency multiplication. Example applications include, but are not limited to, an antenna on a chip, a chip for millimeter wave body scanning applications, K, Ka and/or Ku band applications, W band to G band signal chains, other millimeter wave applications, a circuit that converts a local oscillator frequency to a higher frequency, a transceiver, etc.

Figure 9:
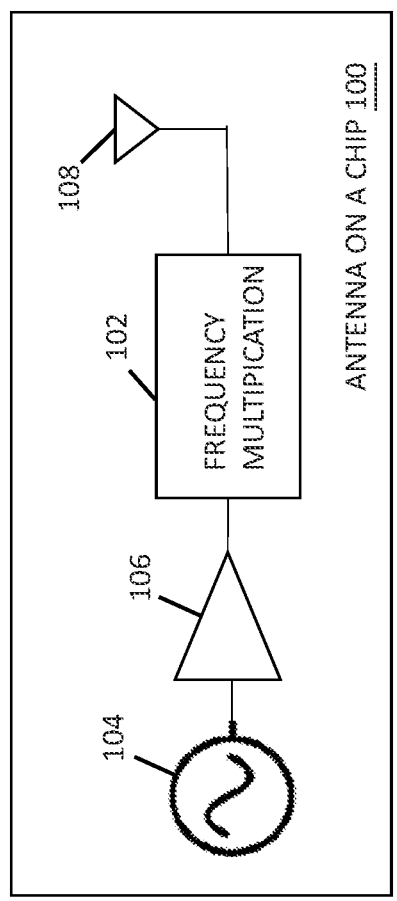
FIG. 9 is a schematic block diagram of an antenna on a chip with a frequency multiplier according to an embodiment.

An application for a frequency multiplier is provided in FIG. 9. FIG. 9 is a schematic block diagram of an antenna on a chip 100 with a frequency multiplication circuit 102 according to an embodiment. All of the illustrated elements can be implemented on a single chip. The frequency multiplication circuit 102 can be implemented in accordance with any suitable principles and advantages disclosed herein. The antenna on a chip 100 includes a local oscillator 104 that generates a local oscillator signal. An amplifier 106 amplifies the local oscillator signal for the frequency multiplication circuit 102. The frequency multiplication circuit 102 can generate an output signal that is a positive even integer multiple of the local oscillator signal. An antenna 108 can be coupled to an output of the frequency multiplication circuit 102. The antenna 108 can transmit a radio frequency signal. One or more other circuit elements can be included in the signal chain from the local oscillator 103 to the antenna 108.

In the embodiments described above, circuits, apparatus, systems, and methods for frequency multiplication are described in connection with particular embodiments. It will be understood, however, that the principles and advantages of the embodiments can be used for any other circuit, systems, apparatus, or methods with a need for frequency multiplication.

Devices employing the above-described technology can be implemented into various electronic devices. Examples of electronic devices include, but are not limited to, radio frequency communication systems and components thereof, consumer electronic products, electronic test equipment, communication infrastructure, etc. For instance, one or more frequency multiplication circuits can be included in a wide range of RF communication systems, including, but not limited to, radar systems, base stations, mobile devices (for instance, smartphones or handsets), phased array antenna systems, laptop computers, tablets, and/or wearable electronics.

The teachings herein are applicable to RF communication systems operating over a wide range of frequencies, including not only RF signals between 100 MHZ and 7 GHz, but also to higher frequencies, such as those in the X band (about 7 GHz to 12 GHz), the $K_u$ band (about 12 GHz to 18 GHZ), the K band (about 18 GHz to 27 GHZ), the $K_a$ band (about 27 GHz to 40 GHZ), the V band (about 40 GHz to 75 GHZ), and/or the W band (about 75 GHz to 110 GHZ). Moreover, the teachings herein are application to microwave circuits and related communication systems operating at microwave frequencies. Accordingly, the teachings herein are applicable to a wide variety of communication systems, including microwave communication systems.

Unless the context clearly requires otherwise, throughout the description and the claims, the words "comprise," "comprising." "include," "including." and the like are to be construed in an inclusive sense, as opposed to an exclusive or exhaustive sense; that is to say, in the sense of "including, but not limited to." The words "coupled" or connected", as generally used herein, refer to two or more elements that may be either directly connected, or connected by way of one or more intermediate elements. Thus, although the various schematics shown in the figures depict example arrangements of elements and components, additional intervening elements, devices, features, or components may be present in an actual embodiment (assuming that the functionality of the depicted circuits is not adversely affected). Additionally, the words "herein," "above," "below." and words of similar import, when used in this application, shall refer to this application as a whole and not to any particular portions of this application. Where the context permits, words in the Detailed Description using the singular or plural number may also include the plural or singular number, respectively. The words "or" in reference to a list of two or more items, is intended to cover all of the following interpretations of the word: any of the items in the list, all of the items in the list, and any combination of the items in the list. All numerical values provided herein are intended to include similar values within a measurement error.

Moreover, conditional language used herein, such as, among others, "can," "could." "might," "may." "e.g.," "for example." "such as" and the like, unless specifically stated otherwise, or otherwise understood within the context as used, is generally intended to convey that certain embodiments include, while other embodiments do not include, certain features, elements and/or states.

The teachings of the inventions provided herein can be applied to other systems, not necessarily the systems described above. The elements and acts of the various embodiments described above can be combined to provide further embodiments. The acts of the methods discussed herein can be performed in any order as appropriate. Moreover, the acts of the methods discussed herein can be performed serially or in parallel, as appropriate.

While certain embodiments of the inventions have been described, these embodiments have been presented by way of example only, and are not intended to limit the scope of the disclosure. Indeed, the novel circuits, methods, apparatus, and systems described herein may be embodied in a variety of other forms. Furthermore, various omissions, substitutions and changes in the form of the circuits, methods, apparatus and systems described herein may be made without departing from the spirit of the disclosure. For example, while the disclosed embodiments are presented in given arrangements, alternative embodiments may perform similar functionalities with different components and/or circuit topologies, and some elements may be deleted, moved, added, subdivided, combined, and/or modified. Each of these elements may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure. Accordingly, the scope of the present inventions is defined by reference to the claims.

Although the claims presented here are in single dependency format for filing at the USPTO, it is to be understood that any claim may depend on any preceding claim of the same type except when that is clearly not technically feasible.

What is claimed is:

1. A frequency multiplication circuit for multiplying frequency of a radio frequency signal, the frequency multiplication circuit comprising:
   a frequency multiplier configured to multiply a frequency of a radio frequency input signal and to generate a radio frequency output signal, the frequency multiplier comprising a pair of balanced transistors; and
   an input matching network coupled to the frequency multiplier, the input matching network comprising a transmission line electrically connected between an input terminal of a first transistor of the pair of balanced transistors and an input terminal of a second transistor of the pair of balanced transistors, the transmission line configured to provide a frequency trap for an even harmonic of the radio frequency input signal and to present a shunt inductance to ground at a frequency of the radio frequency input signal.

2. The frequency multiplication circuit of claim 1, wherein the even harmonic is a second harmonic.

3. The frequency multiplication circuit of claim 1, wherein a frequency of the radio frequency output signal is two times a frequency of the radio frequency input signal.

4. The frequency multiplication circuit of claim 1, wherein the transmission line has a length of λ/4, and λ is a wavelength of the radio frequency input signal.

5. The frequency multiplication circuit of claim 1, wherein an output terminal of a first transistor of the pair of balanced transistors is electrically connected to an output terminal of a second transistor of the pair of balanced transistors.

6. The frequency multiplication circuit of claim 1, wherein the radio frequency input signal is a differential signal, and the radio frequency output signal is a single-ended signal.

7. The frequency multiplication circuit of claim 6, wherein the input matching network further comprises a pair of series capacitors, and the pair of balanced transistors are configured to receive the radio frequency input signal by way of the pair of series capacitors.

8. The frequency multiplication circuit of claim 1, wherein the frequency of the radio frequency input signal is in a range from 30 gigahertz to 100 gigahertz.

9. A frequency multiplication circuit for multiplying frequency of a radio frequency signal, the frequency multiplication circuit comprising:
a frequency multiplier comprising a pair of balanced transistors, the frequency multiplier configured to receive a radio frequency input signal and generate a radio frequency output signal having a frequency that is two times a frequency of the radio frequency output signal; and
an input matching network comprising a transmission line electrically connected between an input terminal of a first transistor of the pair of balanced transistors and an input terminal of a second transistor of the pair of balanced transistors, the transmission line having a length of λ/4 where λ is a wavelength of the radio frequency input signal, and the transmission line configured to present a short circuit impedance at an even harmonic of the radio frequency input signal and to present a shunt inductor at the frequency of the radio frequency input signal.

10. The frequency multiplication circuit of claim 9, wherein the radio frequency input signal is a differential signal, and the radio frequency output signal is a single ended signal.

11. The frequency multiplication circuit of claim 10, wherein the input matching network further comprises a first series capacitor and a second series capacitor, and the frequency multiplier is configured to receive the radio frequency input signal by way of the first series capacitor and the second series capacitor.

12. The frequency multiplication circuit of claim 11, further comprising a balun having balanced terminals including a first terminal electrically connected to the first series capacitor and a second terminal electrically connected to the second series capacitor.

13. The frequency multiplication circuit of claim 9, wherein the pair of balanced transistors comprise bipolar transistors, and the input terminal of the first transistor of the pair of balanced transistors is a base of the first transistor.

14. The frequency multiplication circuit of claim 9, wherein the frequency multiplier further comprises a cascode transistor arranged in cascode with the pair of balanced transistors.

15. The frequency multiplication circuit of claim 9, further comprising a biasing element configured to provide a bias voltage to the input terminal of the first transistor of the pair of balanced transistors.

16. The frequency multiplication circuit of claim 9, wherein the frequency of the radio frequency input signal is in a range from 30 gigahertz to 100 gigahertz.

17. The frequency multiplication circuit of claim 9, wherein the frequency of the radio frequency output signal is in a range from 100 gigahertz to 200 gigahertz.

18. An antenna on a chip with frequency multiplication circuitry, the antenna on the chip comprising:
an oscillator;
a frequency multiplier coupled to an output of the oscillator, the frequency multiplier comprising a pair of balanced transistors, the frequency multiplier configured to receive a radio frequency input signal and generate a radio frequency output signal having a frequency that is two times a frequency of the radio frequency input signal;
an input matching network comprising a transmission line configured to provide a frequency trap for a second harmonic of the radio frequency input signal and to present a shunt inductance to ground at a frequency of the radio frequency input signal, the transmission line electrically connected between an input terminal of a first transistor of the pair of balanced transistors and an input terminal of a second transistor of the pair of balanced transistors; and
an antenna coupled to the frequency multiplier, wherein the oscillator, the frequency multiplier, the input matching network, and the antenna are embodied on a single chip.

19. The antenna on a chip of claim 18, wherein the transmission line has a length of λ/4, and λ is a wavelength of the radio frequency input signal.

20. The antenna on a chip of claim 18, wherein the frequency of the radio frequency input signal is in a range from 30 gigahertz to 100 gigahertz.

* * * * *